US008447573B2

(12) United States Patent
Allione et al.

(10) Patent No.: US 8,447,573 B2
(45) Date of Patent: May 21, 2013

(54) METHOD OF MANUFACTURING AN OPTICAL SYSTEM

(75) Inventors: Pascal Allione, Charenton le Pont (FR); Gilles Le Saux, Charenton le Pont (FR); Jean-Pierre Chauveau, Charenton le Pont (FR); Denis Mazuet, Charenton le Pont (FR)

(73) Assignee: Essilor International (Compagnie Generale d'Optique), Charenton le Pont (FR)

( * ) Notice: Subject to any disclaimer, the term of this patent is extended or adjusted under 35 U.S.C. 154(b) by 322 days.

(21) Appl. No.: 11/997,359

(22) PCT Filed: Aug. 1, 2006

(86) PCT No.: PCT/IB2006/003220
§ 371 (c)(1),
(2), (4) Date: Jan. 30, 2008

(87) PCT Pub. No.: WO2007/017766
PCT Pub. Date: Feb. 15, 2007

(65) Prior Publication Data
US 2009/0125137 A1    May 14, 2009

(30) Foreign Application Priority Data
Aug. 11, 2005   (EP) .................................. 05291716

(51) Int. Cl.
*G06F 17/50* (2006.01)
(52) U.S. Cl.
USPC ............................................. 703/1; 351/177
(58) Field of Classification Search
USPC ............................................... 703/1; 351/177
See application file for complete search history.

(56) References Cited

U.S. PATENT DOCUMENTS

| 2,405,989 | A | 8/1946 | Beach |
| 4,002,439 | A | 1/1977 | Volk et al. |
| 6,089,713 | A | 7/2000 | Hof et al. |
| 6,193,370 | B1 | 2/2001 | Shirayanagi et al. |
| 6,789,898 | B2 * | 9/2004 | Le Saux et al. ............... 351/159 |

(Continued)

FOREIGN PATENT DOCUMENTS

| EP | 1018691 | 7/2000 |
| GB | 2241911 | 9/1991 |

OTHER PUBLICATIONS

P. Allione et al., "Application of optimization in computer-aided ophthalmic lens design", May 1999, EUROPTO Conference on Design and Engineering of Optical Systems, SPIE vol. 3737, pp. 138-148.*

(Continued)

*Primary Examiner* — Dwin M Craig
*Assistant Examiner* — Russ Guill
(74) *Attorney, Agent, or Firm* — Cozen O'Connor (57) ABSTRACT

The invention relates to a method of calculating an optical system (OS), the optical system (OS) being identified by a function (OF), the optical system (OS) comprising a first part (F1) defined by a first equation (EF1) and a second part (F2) defined by a second equation (EF2), the method comprising: —a generating step (GEN), in which a virtual optical system (VOS) is used to generate a virtual function (VOF); —a modification step (MOD), in which the virtual function (VOF) is modified so as obtain the function (OF); —a calculation step (CAL), in which the second equation (EF2) is calculated from the function (OF), and the first equation (EF1). The invention relates also to a method of manufacturing an optical system (OS).

13 Claims, 9 Drawing Sheets

U.S. PATENT DOCUMENTS

| | | | |
|---|---|---|---|
| 6,955,433 B1 * | 10/2005 | Wooley et al. | 351/177 |
| 7,159,982 B2 * | 1/2007 | Shinohara et al. | 351/177 |
| 2002/0018178 A1 | 2/2002 | Shirayanagi et al. | |
| 2003/0090623 A1 * | 5/2003 | Rubinstein et al. | 351/177 |
| 2003/0206270 A1 | 11/2003 | Katzman et al. | |
| 2005/0052615 A1 * | 3/2005 | Wang et al. | 351/168 |
| 2005/0197809 A1 * | 9/2005 | Dowski et al. | 703/6 |
| 2005/0270482 A1 * | 12/2005 | Fisher et al. | 351/177 |
| 2007/0132945 A1 * | 6/2007 | Haser et al. | 351/159 |

OTHER PUBLICATIONS

Joachim Loos et al., "A variational approach to progressive lens design," 1998, Computer-Aided Design, vol. 30, No. 8, pp. 595-602.*

J. Loos et al., "Using wavefront tracing for the visualization and optimization of progressive lenses," 1998, Computer Graphics Forum, vol. 17, issue 3, 12 pages.*

\* cited by examiner

METHOD OF MANUFACTURING AN OPTICAL SYSTEM

CROSS-REFERENCE TO RELATED APPLICATIONS

This application is the National Stage of International Application No. PCT/IB2006/003220, filed on Aug. 1, 2006, which claims the priority of European Application No. 05291716.8, filed on Aug. 11, 2005. The contents of both applications are hereby incorporated by reference in their entirety.

FIELD OF THE INVENTION

An aspect of the invention relates to a method calculating and/or a method of manufacturing an optical system, and more particularly a progressive power lens. Other aspects of the invention relate to a method of manufacturing a semi-finished optical system, a computer-program product for calculating and/or manufacturing an optical system, a computer-program product for calculating and/or manufacturing a semi-finished optical system.

BACKGROUND OF THE INVENTION

Progressive power lenses typically comprise a far-vision region having one refractive power, a near-vision region having a different refractive power, and an intermediate progressive region.

According to a common practice, semi-finished progressive lens blanks are provided by lens manufacturer to prescription labs. Generally a semi-finished progressive lens blank comprises a front progressive surface and a back spherical surface ("standard semi-finished lens blank"). A standard semi-finished lens blank having suitable optical characteristics is then selected based on a prescription. The back spherical surface is finally machined and polished by the prescription lab (based on the base curve) so as to obtain a sphero-torical surface complying with the prescription. A progressive power lens complying with the prescription is thus obtained.

SUMMARY OF THE INVENTION

According to an aspect, the invention relates to a method of calculating an optical system OS, the optical system OS being identified by a function OF, the optical system OS comprising a first part F1 defined by a first equation EF1 and a second part F2 defined by a second equation EF2, the method comprising:
- a generating step GEN, in which a virtual optical system VOS is used to generate a virtual function VOF;
- a modification step MOD, in which the virtual function VOF is modified so as obtain the function OF;
- a calculation step CAL, in which the second equation EF2 is calculated from the function OF, and the first equation EF1.

The optical system OS can be, for example, a progressive power lens. The function OF can be, for example, an optical function OF or a part of an optical function OF. The first part and the second part can be, for example, any volume or surface of the optical system. The optical function OF of an optical system OS is defined as a function h of the opto-geometric properties of the optical system OS, which can be written, for a two parts system comprising a first part F1 and a second part F2, $$OF = h(EF1(x,y,z), EF2(x,y,z))$$

EF1(x,y,z) defining the opto-geometric properties of part F1

EF2(x,y,z) defining the opto-geometric properties of part F2

According to a feature of the invention, the virtual optical system VOS comprises a first virtual part VF1 defined by a first virtual equation EVF1 and a second virtual part VF2 defined by a second virtual equation EVF2, the first virtual equation EVF1 and the second virtual equation EVF2 defining the virtual function VOF.

According to a feature of the invention, the virtual function VOF is substantially equal to the function OF.

According to a feature of the invention, the generating step comprises selecting the first virtual equation EVF1 in a database.

According to a feature of the invention, the method further comprises an equation modifying step, in which the first virtual equation EVF1 is modified by using a first modifying function N1 so as to obtain a first modified equation EV'F1, the first equation EF1 being substantially equal to the first modified equation EVF'1.

According to previous feature, the first virtual part VF1 comprises a first volume of the virtual optical system VOS, the first equation depending on opto-geometric characteristics of the first volume, and wherein the first modifying function N1 modifies at least one of said opto-geometric characteristics.

According to previous feature, the opto-geometric characteristics comprise at least one characteristic chosen among the equation of a surface and the optical index of a volume.

According to another feature of the invention, the first virtual part VF1 is a first virtual surface and the second virtual part VF2 is a second virtual surface.

According to previous feature of the invention, the function OF depends on the difference of the equations of the first surface and the second surface, and wherein a second surface modifying function N2 is substantially equal to the first surface modifying function N1.

According to another feature of the invention, the function OF is an optical function OF.

According to a feature of the invention, the optical system OS is a progressive power lens.

According to another aspect, the invention relates to a method of manufacturing an optical system OS, the optical system OS being identified by a function OF, the optical system OS comprising a first part F1 defined by a first equation EF1 and a second part F2 defined by a second equation EF2, the method comprising:
- the generating step GEN, modification step MOD, calculation step CAL as previously disclosed, in which the second equation EF2 is calculated from the function OF, and the first equation EF1;
- providing a semi-finished optical system MSFOS with a semi-finished optical system SFOS comprising the first part F1; and
- a manufacturing step M2, in which the semi-finished optical system MSFOS is manufactured so as to be further provided with a second part F2 defined by the second equation EF2 and to obtain the optical system OS.

According to a feature of the invention

According to another aspect, the invention relates to a method of manufacturing an optical system OS, the optical system OS being identified by a function OF, the optical system OS comprising a first part F1 defined by a first equation EF1 and a second part F2 defined by a second equation EF2, the method comprising:

the generating step GEN, modification step MOD, calculation step CAL as previously disclosed, in which the second equation EF2 is calculated from the function OF, and the first equation EF1;

a first manufacturing step M1 in which a semi-finished optical system SFOS comprising the first part F1 is manufactured so as to obtain a manufactured semi-finished optical system MSFOS; and a second manufacturing step M2, in which the manufactured semi-finished optical system MSFOS is manufactured so as to be further provided with a second part F2 defined by the second equation EF2 and to obtain the optical system OS.

According to the invention, the first manufacturing step M1 defines the opto-geometric characteristics EF1$(x,y,z)$ of the first part F1 of the semi-finished optical system. Thus, by choosing a suitable second part F2, the invention allows the manufacture of an optical system such that OF=h (EF1$(x,y,z)$, EF2$(x,y,z)$).

In other words, if a semi-finished optical system was manufactured according to the first manufacturing step M1, and was firstly intended to be modified to manufacture a first optical system OS1 having an optical function OF1, the semi-finished optical system can advantageously be used to manufacture a second optical system OS2, having a second optical function OF2. In this respect, the second equation EF2 has just to be chosen such that OF2=h (EF1$(x,y,z)$), EF2$(x,y,z)$)), and not OF1=h (EF1$(x,y,z)$), EF2$(x,y,z)$)).

Therefore, the optical system does not depend on the characteristics of the semi-finished optical system only. This allows a manufacturer to stock semi-finished optical system independently of the optical system. Thus, the invention enables to enhance the stock management in a manufacturing process.

According to a feature of the invention the second manufacturing step M2 comprises the following sub-steps:

a second modifying step MS2, in which the second virtual equation EVF2 is modified by using a second modifying function N2 so as to obtain a second modified equation EV'F2, the first modifying function N1 and the second modifying function N2 being defined in such a manner that the optical system can be identified by the function OF, and a second manufacturing step MAN2, in which the second part F2 of the semi finished optical system SFOS is manufactured so as to obtain the optical system OS, the second equation EF2 of the second part F2 being substantially equal to the second modified equation EV'F2.

According to previous feature, the second virtual part VF2 comprises a second volume of the virtual optical system VOS, the second equation depending on opto-geometric characteristics of the second volume, and wherein the second modifying function N2 modifies at least one of said opto-geometric characteristics.

According to another aspect, the invention relates to a method of manufacturing an optical system OS, the optical system OS being identified by a function OF, the optical system OS comprising a first part F1 defined by a first equation EF1 and a second part F2 defined by a second equation EF2, the method comprising:

the generating step GEN, modification step MOD, calculation step CAL as previously disclosed, in which the second equation EF2 is calculated from the function OF, and the first equation EF1;

a first manufacturing step M1, in which a semi-finished optical system SFOS comprising the first part F2 is manufactured so as to obtain a manufactured semi-finished optical system MSFOS; and a second manufacturing step M2, in which the manufactured semi-finished optical system MSFOS is manufactured so as to be further provided with a first part F1 defined by the first equation EF1 and to obtain the optical system OS For the purpose of the present application, the term "virtual" is used to define an optical system which is calculated and generated by a computer. According to the present invention, the virtual optical system is not intended to be manufactured as such.

By generating a virtual optical system and defining the optical function as a modification of a virtual optical function, one can ensure that the calculation step CAL according to the invention has a solution. For example, if the optical function OF is substantially equal to the virtual optical function VOF, and the first equation EF1 is substantially equal to the first virtual equation, the second virtual equation EVF2 is a physical solution for the second equation EF2.

The virtual optical function can, for example, be modified by using prescription data provided by an Eye Care Practitioner. Thus, by modifying this virtual function, the optical function can be more adapted to the characteristics of the eye.

Moreover, by defining the optical function from the modification of a virtual optical function, memory space is saved. In fact, instead of storing the optical functions for each specific client, the method according to the invention allows to store a generic virtual function and to modify it by a specific modification.

According to another aspect, the generating step according to the invention comprises selecting the first virtual equation EVF1 in a database.

By selecting the first virtual equation in a database of known virtual equations, one can ensure that the performances of the optical system can be those of an existing system.

Moreover, by avoiding the calculation of a specific first equation and by selecting the equation in a database, calculation time is saved.

According to another aspect of the invention, the method further comprises an equation modifying step, in which the first virtual equation EVF1 is modified by using a first modifying function N1 so as to obtained a first modified equation EV'F1, the first equation EF1 being substantially equal to the first modified equation EVF'1.

The first modifying function N1 can be, for example, arranged to modify the opto-geometric characteristics of the first virtual part VF1 such that:

$$OF=h(N1(VF1(x,y,z)),EF2(x,y,z)))$$

By providing standard semi finished optical system to prescription labs, it is quite easy to obtain data that might be considered by the lens manufacturer as secret data. This can be achieved, for example, by using well-known three dimensional measuring systems. The secret data can be, for example, data relating to the geometry of the progressive face of the semi-finished lens blank. The secret data can also be, for example, any opto-geometric characteristics in particular the equations of the surfaces defining the two parts, or the optical index of the two parts, or any combination thereof.

By using the first modifying function in order to modify the first parts of a virtual optical system VOS in order to manufacture a semi finished optical system and an optical system having the required optical function, the secret data are split up between the first and the second part of the optical system. Thus it is more difficult to deduce the secret data by using a measuring system.

The invention also concerns a computer program product for a data-processing device, the computer program product comprising a set of instructions which, when loaded into the data-processing device, causes the device to perform the steps of the method according to the invention, for an optical system, or for a semi-finished optical system.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features and advantages thereof, may best be understood by reference to the following detailed description when read with the accompanied drawings in which:

DETAILED DESCRIPTION

Unless specifically stated otherwise, as apparent from the following discussions, it is appreciated that throughout the specification discussions utilizing terms such as "computing", "calculating" "generating", or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

Embodiments of the present invention may include apparatuses for performing the operations herein. This apparatus may be specially constructed for the desired purposes, or it may comprise a general purpose computer or Digital Signal Processor ("DSP") selectively activated or reconfigured by a computer program stored in the computer. Such a computer program may be stored in a computer readable storage medium, such as, but is not limited to, any type of disk including floppy disks, optical disks, CD-ROMs, magnetic-optical disks, read-only memories (ROMs), random access memories (RAMs) electrically programmable read-only memories (EPROMs), electrically erasable and programmable read only memories (EEPROMs), magnetic or optical cards, or any other type of media suitable for storing electronic instructions, and capable of being coupled to a computer system bus.

The processes and displays presented herein are not inherently related to any particular computer or other apparatus. Various general purpose systems may be used with programs in accordance with the teachings herein, or it may prove convenient to construct a more specialized apparatus to perform the desired method. The desired structure for a variety of these systems will appear from the description below. In addition, embodiments of the present invention are not described with reference to any particular programming language. It will be appreciated that a variety of programming languages may be used to implement the teachings of the inventions as described herein.

The optical function OF of an optical system OS can be defined as follows:

$$OF(x,y,z)=MAT(x,y,z)+PRES; \text{ or} \quad (1)$$

$$OF(x,y,z)=MAT(PUI(x,y,z);AST(x,y,z))+PRES; \text{ or} \quad (2)$$

$$OF(x,y,z)=h(F1(x,y,z);F2(x,y,z);n(x,y,z)) \quad (3)$$

MAT being an array of power and astigmatism;
PUI being an array of power;
AST being an array of astigmatism;
PRES being prescription data;
F1 and F2 being the equation of the first face and of the second face of the optical system; and
n being the optical index.

It has to be noted that if the optical index is a constant, the optical function OF of an optical system can be defined as follows:

$$OF(x,y,z)=h(F1(x,y,z);F2(x,y,z)) \quad (4)$$

Figure 1A:
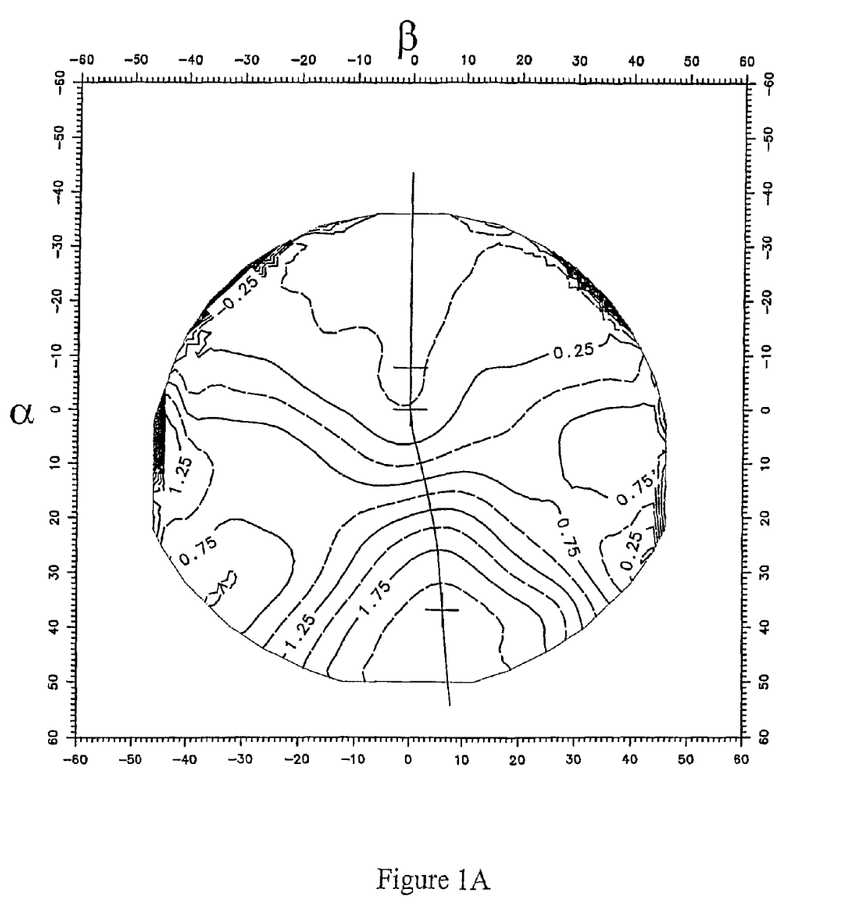
FIG. 1A shows a graphical representation of an array of power.
Figure 1B:
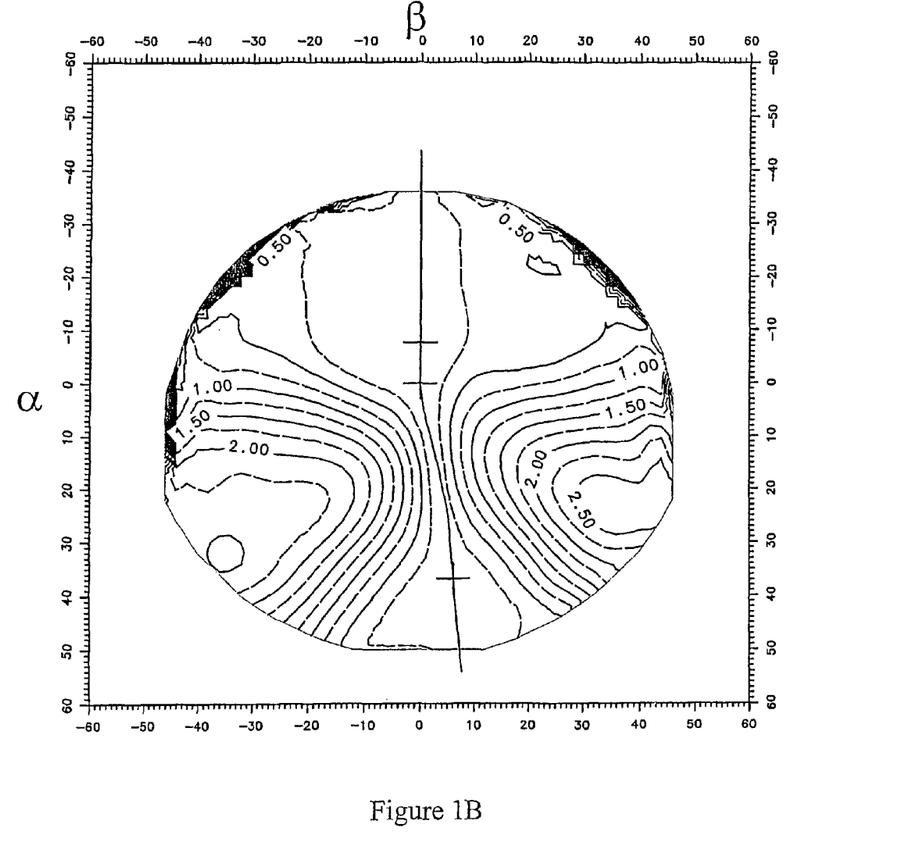
FIG. 1B shows a graphical representation of an array of astigmatism.
Figure 1C:
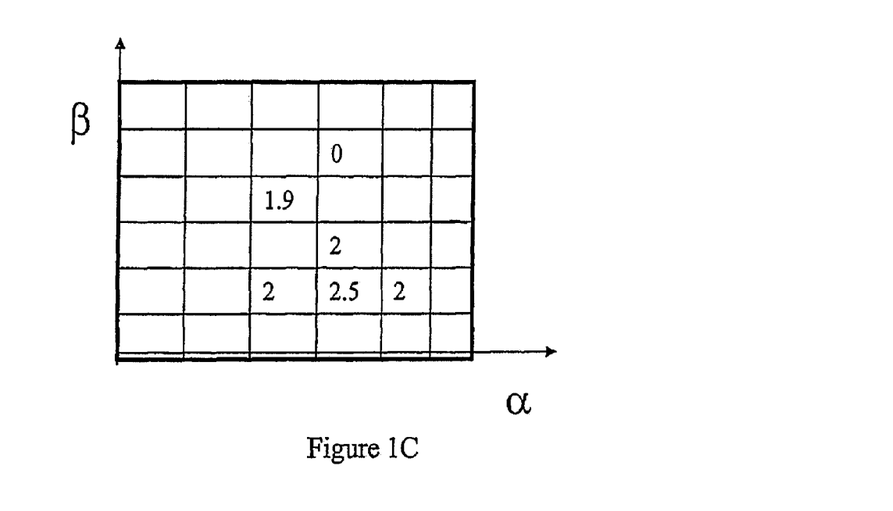
FIG. 1C shows an example of data used to determine the optical function of an optical system.
Figure 1D:
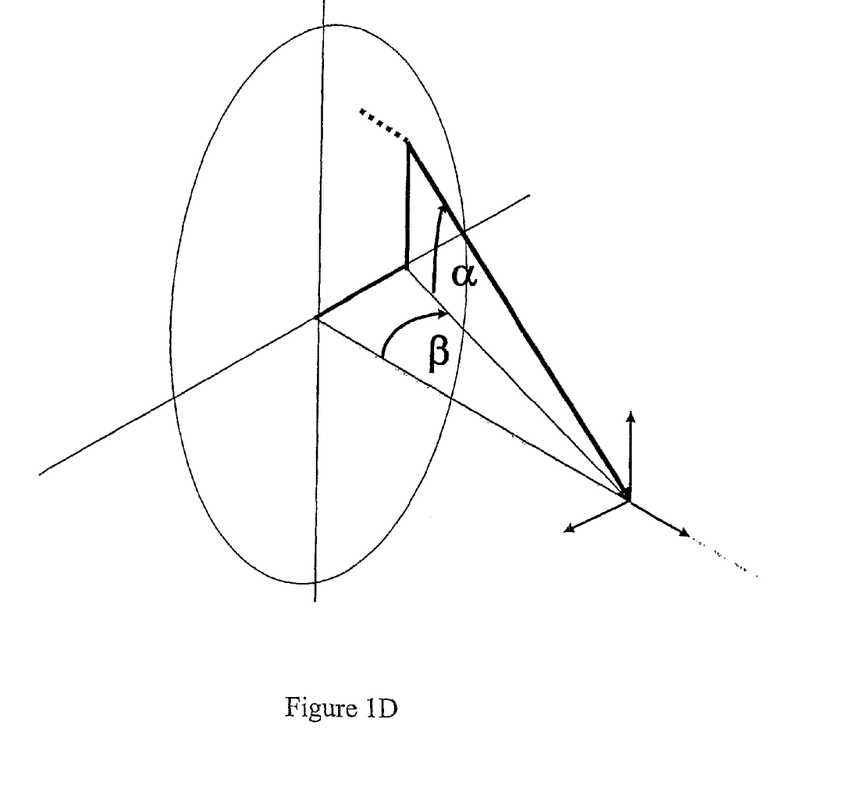
FIG. 1D shows the longitude and latitude data used to represent the array of power and the array of astigmatism.

An example of graphical representation of an array of power PUI and of an array of astigmatism AST is shown at FIG. 1A and FIG. 1B. These arrays (PUI,AST) have been obtained for a design suitable for a user with emmetropia addition 2. Illustrated FIG. 1D, the gaze direction is defined by two angles, latitude $\alpha$ and longitude $\beta$ from the center of rotation of the eye. The aberrations are calculated for each gaze direction to obtain array MAT and array PUI.

The prescription data PRES are known by the one skilled in the art and are related to usual data provided by an Eye Care Practitioner such as sphere, cylinder, axe, prism, power addition. Additional data provided by an optician can be used if available.

Advantageously, but not limited to, in the ophthalmic field the optical function can be obtained by adding the prescribed values of power and astigmatism to specific arrays, respectively PUI and AST. In general, these specific arrays can be given, for example, for each addition and ametropia type (myopia, hyperopia, emmetropia).

In order to better understand the invention, a method of manufacturing an optical system OS in the form of a progressive power lens will now be described in a detailed manner. In this particular example, the optical index can be chosen as a constant. The optical function of an optical system can thus be defined as follows:

$$OF=h(F1(x,y),F2(x,y)) \quad (5)$$

Figure 2:
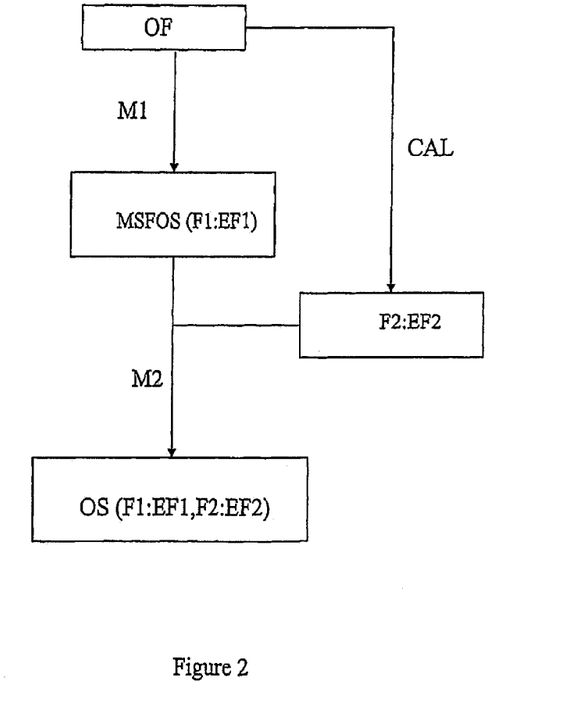
FIG. 2 is a block diagram of the manufacturing process according to the invention.

As illustrated FIG. 2, the method of manufacturing a progressive power lens OS comprises a manufacturing step M1 in which a semi-finished optical system comprising a first part F1 is manufactured. The first part F1 is defined by a first equation EF1, which is for example the equation of an outer surface. A manufactured semi-finished optical system MSFOS is thus obtained.

According to the invention, the equation of the second part EF2 is then determined in a calculation step CAL from the optical function and the equation of the first part EF1. Equations (5) and (4) are used to determine such an equation from the optical function OF and the equation of the first surface EF1.

The calculation step CAL can be performed by using a ray-tracing method or optimization algorithms. These methods are known by the one skilled in the art, for example in the publication "Application of optimization in computer-aided ophthalmic lens design" (P. Allione, F. Ahsbhs and G. Le Saux, in SPIE Vol. 3737, EUROPTO Conference on Design and Engineering of Optical Systems, Berlin, May 1999), which is incorporated by reference in the present document.

In a second manufacturing step M2, the manufactured semi-finished optical system MSFOS is manufactured so as to obtain a second part of equation EF2. This can be done by any known method in the art of manufacturing lenses as described, for example, in the US granted patent referenced under grant number U.S. Pat. No. 6,558,586 B1, the content of which is incorporated by reference.

The manufactured semi-finished optical system MSFOS further provided with a second part F2 of equation EF2 forms the optical system OS.

In a particular embodiment, the optical function OF of the optical system OS to be manufactured is based on a virtual optical function VOF.

Figure 4A:
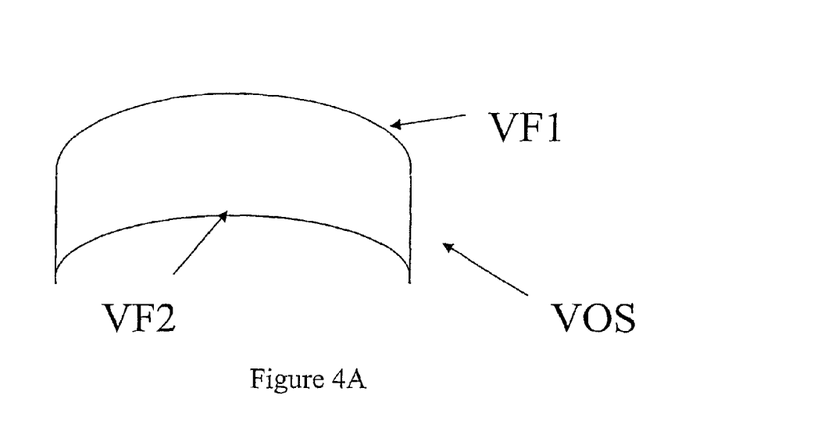
FIG. 4A schematically illustrates a virtual system generated according to the present invention.
Figure 4B:
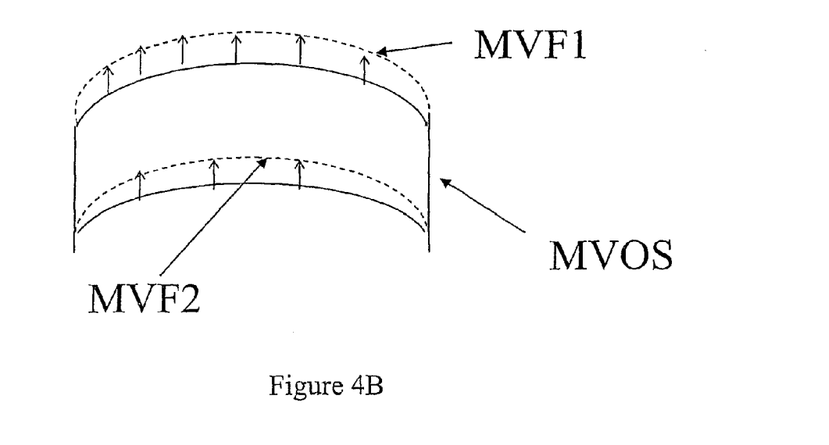
FIG. 4B schematically illustrates a modified virtual system according to the present invention.

In a virtual optical system generating step GEN, a virtual progressive power lens VOS having a virtual optical function VOF is generated. As illustrated in FIGS. 4A and 4B, the virtual progressive power lens VOS comprises a first virtual face VF1 which is defined by a first equation EVF1. The virtual progressive power lens VOS farther comprises a second virtual face VF2 which is defined by a second equation EVF2.

The virtual optical function VOF can then be modified in a modification step MOD to obtain an optical function OF. The modified virtual optical system MVOS has a modified first face MVF1 and a modified second face MVF2.

The modification MOD can be made by using prescription data from an Eye Care Practitioner to be adapted to the prescription.

The modification MOD can be without limitation an isometric transformation such as offset, symmetry, translation, or a morphing of the virtual optical system VOS.

If the modification is chosen as the identity function, the modified virtual optical system is the virtual optical system, and the optical function is substantially equal to the virtual optical function.

A preset virtual optical function VOF can then be retrieved directly from a database to define the opto-geometric characteristics of the virtual optical system.

The modification step MOD can then be used to adapt this virtual optical function VOF to the needs of a particular wearer.

For example, if a database containing virtual optical function is available, one can choose, among the database, a virtual optical function corresponding to the general characteristics of the wearer. A more accurate adaptation of this virtual optical function is then performed in a modification step MOD to adapt the optical system OS to the more precise needs of the wearer.

Figure 3:
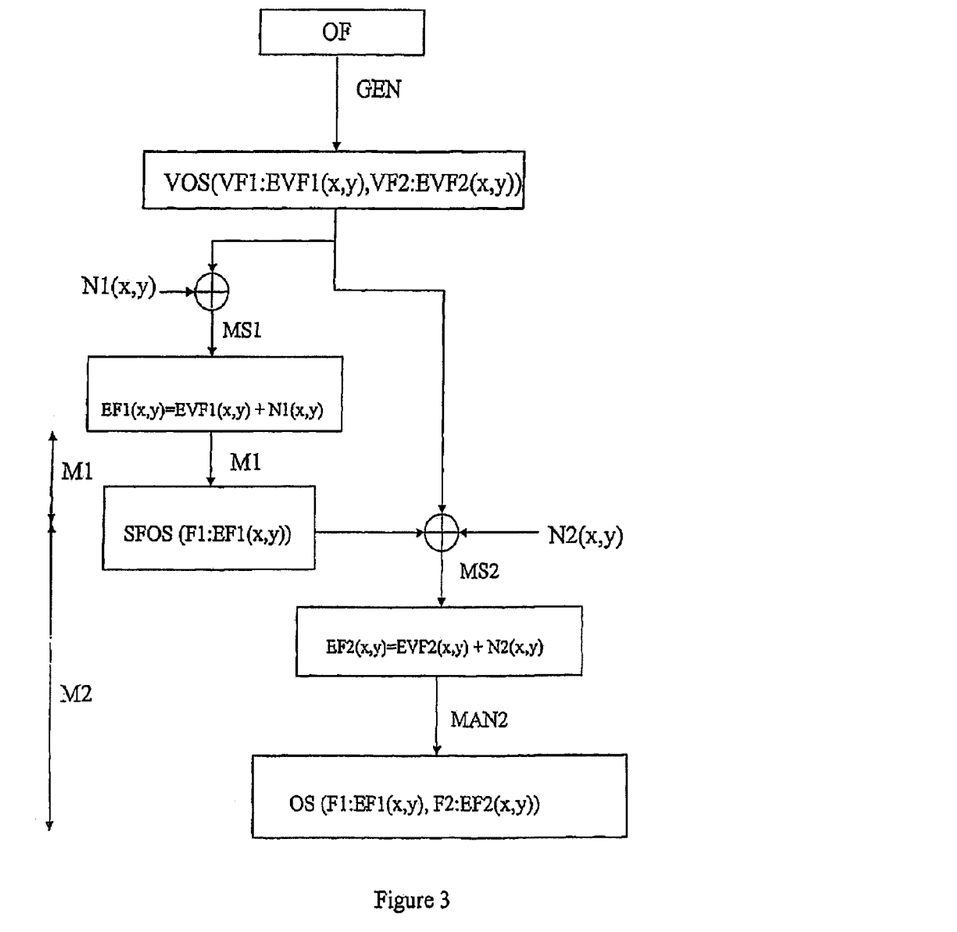
FIG. 3 is a block diagram of an embodiment of the manufacturing process according to the invention.

As illustrated in FIG. 3, according to another aspect, the method of manufacturing a progressive power lens OS comprises a first manufacturing step M1 and a second manufacturing step M2. It further comprises a virtual optical system generating step GEN and a first modifying stop MS1.

Figure 5A:
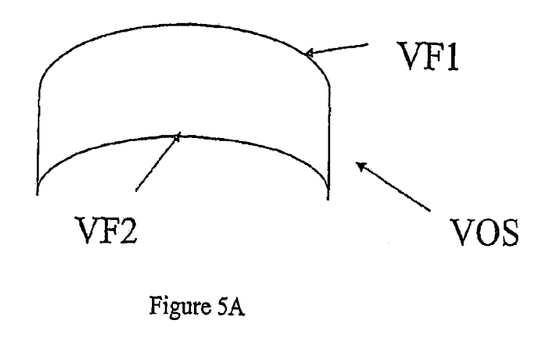
FIG. 5A schematically illustrates a virtual system generated according to the present invention.

In the virtual optical system generating step GEN, a virtual progressive power lens VOS having a virtual optical function VOF is generated. As illustrated in FIG. 5A, the virtual progressive power lens VOS comprises a first virtual face VF1 which is defined by a first equation EVF1. The virtual progressive power lens VOS further comprises a second virtual face VF2 which is defined by a second equation EVF2. The first equation EVF1 and the second equation EVF2 are chosen such that:

$$VF(x,y,z)=vh(EVF1(x,y,z),EVF2(x,y,z))$$

EVF1$(x,y)$ and EVF2$(x,y)$ can be defined, for example, such that the optical function VF of the virtual progressive power lens VOS is substantially equal to the optical function OF of the progressive power lens OS.

As illustrated in FIG. 3, in a first modifying step MS1, the first equation EVF1$(x,y)$ is modified, for example, by adding a first encryption function N1$(x,y)$ so as to obtain a modified equation EV'F1 defined as follows:

$$EV'F1(x,y)=EVF1(x,y)+N1(x,y).$$

Then, in a first manufacturing step M1, a first surface F1 of a semi-finished optical system SFOS is manufactured. The equation EF1 of the first surface F1 is defined as follows:

$$EF1(x,y)=EV'F1(x,y)$$

Figure 5B:
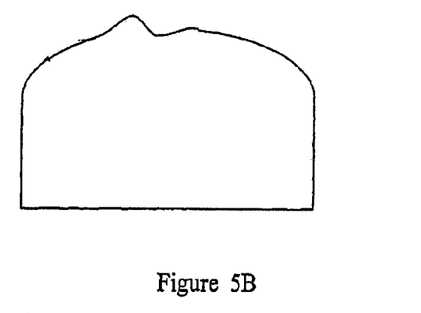
FIG. 5B schematically illustrates a semi-finished optical system manufactured according to the present invention.

A semi-finished optical system SFOS is thus obtained. The manufacturing of the semi-finished optical system SFOS can be done by any known method in the art of manufacturing lenses as described, for example, in the US granted patent referenced under grant number U.S. Pat. No. 6,558,586 B1, the content of which is incorporated by reference. It has to be noted that, the first encrypting function N1$(x,y)$ is a secret data which is only known by the one implementing the method of manufacturing of the invention. The first encrypting function N1 can be more generally any secret transformation of the function EVF1$(x,y)$ such that $$EF1(x,y)=N1[EVF1(x,y)].$$

Thus when analyzing the semi-finished optical system SFOS, it will be more difficult for a third party to access to the secret data EVF1$(x,y)$ and EVF2$(x,y)$.

As illustrated in FIG. 3, the method of manufacturing a progressive power lens further comprises a second manufacturing step M2. The second manufacturing step M2 comprises a second modifying sub-step MS2 and a second manufacturing sub-step MAN2.

In the second modifying sub-step MS2, the second equation EVF2$(x,y)$ is modified, for example, by adding a second encrypting function N2$(x,y)$ so as to obtained a second modified equation EV'F2$(x,y)$ defined as follows:

$$EV'F2(x,y)=EVF2(x,y)+N2(x,y),$$

The second encryption function N2$(x,y)$ is chosen such that $$OF(x,y)=h(N1[EVF1(x,y)],N2[EVF2(x,y)]).$$

It has to be understood that other constraints can be added in the choice of the first and second encrypting functions N1 and N2. Such constraints can be linked, for example, to calculation time or other constraints defined by manufacturing laboratories.

Figure 5C:
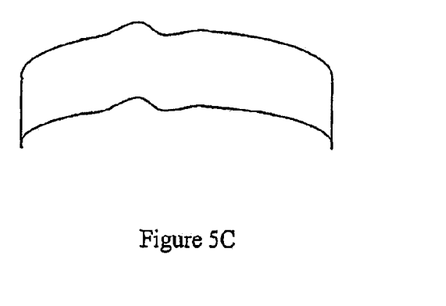
FIG. 5C schematically illustrates an optical system manufactured according to the present invention.

Then in a second manufacturing sub-step MAN2, a second face F2 of the semi-finished optical system SFOS is manufactured so as to obtain the progressive power lens OS. The surface of the second face F2 of the progressive power lens OS is defined by the second modified equation EV'F2$(x,y)$.

It is understood that the first and the second face F1, F2 of the progressive power lens OS must comply with the constraints defined by the optical function OF When the optical function is a function of the difference of the equations of the surfaces, i.e OF=h(EF2$(x,y)$–EF1$(x,y)$), the preferred second encryption function N2$(x,y)$ is substantially equal to N1$(x,y)$.

According to an advantage of the invention, the first encrypting function and the second encrypting N1 and N2 only depend on the optical system OS to be manufactured. A semi-finished optical system SFOS provided with a first face F1 of equation EF1$(x,y)$=N1[EVF1$(x,y)$] can thus be used, for example, to manufacture an optical system OS1 having an optical function OF1. But the same semi-finished optical system SFOS could also be used to manufacture an optical system OS2 having an optical function OF2. In this case, the second encrypting function N2 has to be chosen such that OF2$(x,y)$=h (N1(EVF1$(x,y)$), N2(EVF2$(x,y)$))). The stock management of semi-finished optical systems SFOS can thus be done by associating the semi-finished optical systems SFOS with the optical system to be manufactured. Alternatively the stock management of semi-finished optical systems SFOS can be done independently of the final optical system by choosing suitable modifying functions. The stock management in the manufacturing process is therefore improved.

The detailed description hereinbefore with reference to the drawings illustrates a method of manufacturing an optical system OS, the optical system OS being identified by a function OF, the optical system OS comprising a first part F1 defined by a first equation EF1 and a second part F2 defined by a second equation EF2, the method comprising:

a calculation step CAL, in which the second equation EF2 is calculated from the function OF, and the first equation EF1;

a first manufacturing step M1, in which a semi-finished optical system SFOS comprising the first part F1 is manufactured so as to obtain a manufactured semi-finished optical system MSFOS; and a second manufacturing step M2, in which the manufactured semi-finished optical system MSFOS is manufactured so as to be further provided with a second part F2 defined by the second equation EF2 and to obtain the optical system OS.

The aforementioned characteristics can be implemented in numerous different manners. In order to illustrate this, some alternatives are briefly indicated.

The first part and the second part can correspond to any volume or surface of the optical system.

The first part and the second part can be, for example, a first face and a second face of the optical system corresponding to front and back optical surfaces, or a first volume and a second volume of the optical system corresponding to a back part and a front part of the system. The opto-geometric characteristics can be, for example, the equations of the surfaces defining the two parts, or the optical index of the two parts, or any combination thereof.

The calculation of the second equation EF2 from the function OF, and the first equation EF1 in the calculation step CAL can be performed by any algorithm known in the art of calculation on optical systems.

The detailed description hereinbefore with reference to the drawings also illustrates a method that further comprises the following steps:

a generating step GEN, in which a virtual optical system VOS is used to generate a virtual function VOF, the virtual optical system VOS comprising a first virtual part VF1 defined by a first virtual equation EVF1 and a second virtual part VF2 defined by a second virtual equation EVF2, the first virtual equation EVF1 and the second virtual equation EVF2 defining the virtual function VOF;

a modification step MOD, in which the virtual function VOF is modified so as obtain the function OF.

The modification MOD can be without limitation an isometric transformation such as offset, symmetry, translation, or a morphing of the virtual optical system VOS.

The detailed description hereinbefore with reference to the drawings also illustrates a method which further comprises an equation modifying step, in which the first virtual equation EVF1 is modified by using a first modifying function N1 so as to obtained a first modified equation EV'F1, the first equation EF1 being substantially equal to the first modified equation EVF'1.

The first modifying function N1 can be, for example, an encryption function or a noise function. The noise function can be any discontinuous function such as, for example, a diffractive function, in particular, a Fresnel function. Advantageously, the discontinuous function has a spatial frequency cut-off which is preferably less than 1 mm$^{-1}$ (1/1 millimeter). The noise function can also be, for example, a white noise function. More generally the first function N1 can be any function arranged to modify the opto-geometric characteristics of the parts or surfaces of an optical system.

The detailed description also illustrates a method of manufacturing an optical system OS, wherein the second manufacturing step M2 comprises the following sub-steps:

a second modifying step MS2, in which the second virtual equation EVF2 is modified by using a second modifying function N2 so as to obtain a second modified equation EV'F2, the first modifying function N1 and the second modifying function N2 being defined in such a manner that the optical system can be identified by the function OF, and a second manufacturing step MAN2, in which the second part F2 of the semi-finished optical system SFOS is manufactured so as to obtain the optical system OS, the second equation EF2 of the second part F2 being substantially equal to the second modified equation EV'F2.

The second modifying function N2 can be, for example, an encryption function or noise function, in particular a white noise function The functions described herein have been given in Cartesian coordinates (x,y,z) but it is understood that any coordinate can be used in the method according to the invention.

Figure 6A:
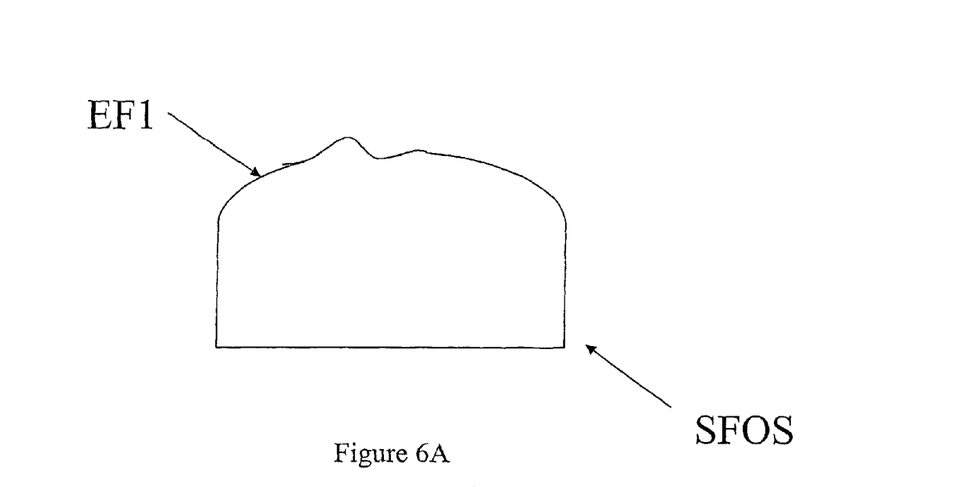
FIG. 6A corresponds to a semi-finished optical system as in FIG. 5B.
Figure 6B:
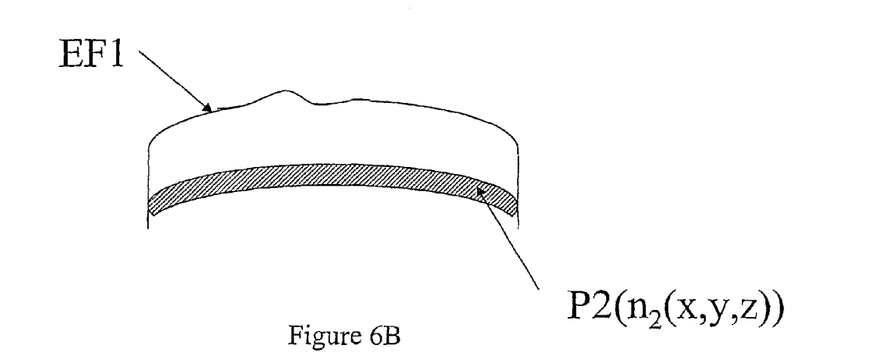
FIG. 6B schematically illustrates an optical system manufactured according to the present invention wherein the optical index has been modified to comply with the optical function.

In the detailed description, the equations of the surfaces of the systems have been modified. It has to be understood that any other opto-geometric characteristics can be modified. As illustrated FIGS. 6A and 6B, the second modifying function N2 can be a modification of the optical index n$_2$(x,y,z) in a part P2 of the modified semi finished optical system. This modification is indicated by dashed lines on FIG. 4B. Therefore, N2 has to be chosen such that OF1=h(N1(EVF1$(x,y)$), N2(P2$(x,y,z)$))). Any modification on the opto-geometric characteristics of the system, either for surface characteristics or volume characteristics can also be chosen, provided it respects the optical function OF or a specific part of the optical function OF of the optical system.

Moreover, in the above examples, the function F was an optical function OF. But the function F can be also a part of such optical function OF. For example, for a given optical system having an optical function OF given by the equation OF (x,y,z)=MAT(x,y,z)+PRES, the function F can be defined by the array of power and astigmatism MAT. In such a case, the modifying functions N1 and N2 are such that MAT=g (EVF1, EVF2), and MAT=g(N1(EVF1), N2(EVF2)). More generally the function F can be any function arranged to identify or define an optical system OS.

Further examples are given to illustrate the present invention with detailed and concrete cases, without any limitation to other concrete applications.

Example 1

Example 1 relates to index variation of the material of a lens.

1.1 Definition of the Virtual Optical System VOS:

VOS is a progressive lens with a progressive front surface and a spherical back surface, such as a VARILUX COMFORT® lens of ESSILOR Company, (for example with a 0 Dioptrie far vision correction), for example a VARILUX COMFORT® Base 5.50 with 2 Dioptries addition, where the material of the lens consists of ORMA® (refractive index=1.5).

The respective position of the front and back surfaces are such as the thickness of the lens is as little as possible and where the thickness in its center is more than 1 mm and its edge's thickness is more than 0.3 mm. The prism between the two surfaces has to compensate the thickness differences between far vision zone and near vision zone due to addition, or is suitable to obtain a given prismatic prescription.

1.2 Building the Virtual Optical Function VOF:

A virtual viewer VV has a prescription with 2 Dioptries addition, with a cylinder correction of 0 Dioptrie and a sphere correction of 0 Dioptrie.

The power and astigmatism is calculated for a set of gaze direction $(a_i, b_i)$ for the system "lens"+"eye" in given environment.

For said optical system OS, virtual optical function is:

$$VOF(OS)=\mathrm{Sum}[\mathrm{weight}\_ast(i)(AST(a_i,b_i,OS)-AST(a_i,b_i,VOS))^2+\mathrm{weight}\_pui(i)(PUI(a_i,b_i,OS)-PUI(a_i,b_i,VOS))^2],$$

Where:

Sum is the sum on i index;

AST(a,b,v) is the astigmatism of optical system v for gaze direction (a,b);

PUI(a,b,v) is the power for gaze direction (a,b) of optical system v.

Following the invention, the lens OS of the real viewer RV, has to be as close as possible including RV prescription.

Modification MOD is then applied.

1.3 Modification MOD of the Virtual Optical Function VOF:

$$MOD(VOF(OS))=\mathrm{Sum}[\mathrm{weight}\_ast(i)(ASR(a_i,b_i,OS,Sph,Cyl,Axe)-AST(a_i,b_i,VOS))^2+\mathrm{weight}\_pui(i)((PUI(a_i,b_i,OS)-Sph)-PUI(a_i,b_i,VOS))^2],$$

Where:

ASR (a,b,v,Sph,Cyl,Axe) is the resulting astigmatism of the lens OS, for the real viewer RW, and when considering his spherical prescription Sph, his cylindrical prescription Cyl, his axial prescription Axe.

It is thus the vectorial difference between the lens OS and the real viewer RV astigmatism.

1.4. Definition of the Lens OS:

Characteristics of OS are for example:

progressive front surface VARILUX COMFORT® base 5.5 addition 2.0 Dioptries;

back surface to be determined in the step CAL;

refractive index of material=1.8;

thickness of the lens as little as possible and where the centre's thickness is more than 1 mm, and the edge's thickness is more than 0.3 mm; the prism between the two surfaces has to compensate the thickness difference between far vision zone and near vision zone due to an addition, or are suitable to obtain a given prismatic prescription.

The front surface may be the same than the one of VOS. Modification due to refractive index modification will then appear on the back surface.

The front surface may be different from the one of VOS, and adapted to the actual refractive index. Said front surface will be consequently calculated.

First part F1 consists of:

front surface;

material of the lens;

relative position of front and back surfaces.

Second part F2 consists of:

back surface

First equation EF1 consists of:

front surface equation;

refractive index;

4×4 array of position changes between front and back surfaces

Second equation EF2 consists of:

equation of back surface.

Front and back surfaces equations can be expressed for example by using two dimensions polynomial functions, such as Zernike polynomes, B-Splines functions, NURBS functions.

1.5 Calculation Step CAL:

Determining back surface parameters to minimize MOD (VOF(OS)).

Curvature parameters may be forced, for example in some regions of far vision zone or near vision zone.

Example 1 shows it is thus possible to manufacture an optical system OS from a virtual optical system VOS, the optical system OS having substantially the same optical properties than those of the virtual optical system VOS, but with a different refractive index.

Example 2

Example 2 relates to a design modification of the progressive surface of a lens.

2.1 Definition of the Virtual Optical System VOS:

Characteristics are for example:

front progressive surface, with its design, for example VARILUX COMFORT® Base 5.50 with an addition of 2.0 Dioptries;

spherical back surface with 0 Dioptrie far vision correction;

ORMA® material (refractive index is 1.5)

respective position of the front and back surfaces are such as the thickness of the lens is as little as possible and where the thickness in its center is more than 1 mm and its edge's thickness is more than 0.3 mm. The prism between the two surfaces has to compensate the thickness differences between far vision zone and near vision zone due to addition, or is suitable to obtain a given prismatic prescription.

2.2 Building the Virtual Optical Function VOF:
Virtual viewer has, for example, a prescription where:
Sph=0 Dioptrie
Cyl=0 Dioptrie
Add=2.0 Dioptries
and same virtual optical function VOF then above following 1.2.

2.3 Modification MOD of the Virtual Optical of the Function VOF:
same step than above following 1.3.

2.4. Definition of the Lens OS:
front progressive surface with an other design than the virtual one, such as for example VARILUX® PANAMIC® Base 5.50 of ESSILOR Company with an addition of 2.0 Dioptries;
back surface to be determined in the step CAL;
refractive index=1.5 (ORMA® material)
thickness of the lens as little as possible and where the centre's thickness is more than 1 mm, and the edge's thickness is more than 0.3 mm; the prism between the two surfaces has to compensate the thickness difference between far vision zone and near vision zone due to an addition, or is suitable to obtain a given prismatic prescription;
First part F1 consists of:
front surface;
material of the lens;
relative position of front and back surfaces.
Second part F2 consists of:
back surface
First equation EF1 consists of:
front surface equation;
refractive index;
4×4 array of position changes between front and back surfaces
Second equation EF2 consists of:
equation of back surface.
Front and back surface equation can be expressed for example by using two dimensions polynomial functions, such as Zernike polynomes, B-Splines functions, NURBS functions.

2.5 Calculation Step CAL:
Same step than above following 1.5
Example 2 shows it is thus possible to manufacture an optical system OS having a particular design, from a semi finished optical system SFOS comprising a part F1 having a different design, the optical system OS having substantially the same optical properties than those of the virtual optical system VOS.

In the above mentioned description, the optical system OS was a progressive power lens. It has to be understood that it can also be any type of optical system, for example, a lens or a multifocal lens. The optical system can also be any device for either concentrating or diverging light. The optical system can also be any analogous device used with other types of electromagnetic radiation such as a microwave lens for example made from paraffin wax. The optical system can also be a part of an imaging system such as monocular, binoculars, telescope, spotting scope, telescoping gun sight, microscope and camera (photographic lens).

The optical system can also be dielectric lens for radio astronomy and radar systems to refract electromagnetic radiation into a collector antenna.

The remarks made herein before demonstrate that the detailed description with reference to the drawings, illustrate rather than limit the invention. There are numerous alternatives, which fall within the scope of the appended claims. Any reference sign in a claim should not be construed as limiting the claim. The word "comprising" does not exclude the presence of other elements or steps than those listed in a claim. The word "a" or "an" preceding an element or step does not exclude the presence of a plurality of such elements or steps.

The invention claimed is:

1. A method of using a computer to provide, to a lens manufacturing machine, information representing an optical system (OS), the optical system (OS) being identified by a function (OF) and including a first part (F1) defined by a first equation (EF1), EF1$(x,y,z)$, which defines opto-geometric properties of part F1 at a spatial location defined by coordinates x, y, and z, and a second part (F2), defined by a second equation (EF2), EF2$(x,y,z)$, which defines opto-geometric properties of part F2, where the first part (F1) and the second part (F2) are a volume or surface of the optical system, (OS), the method comprising:
a first providing step that provides the first equation (EF1), EF1$(x,y,z)$, said first equation (EF1), EF1$(x,y,z)$ defining opto-geometric properties of the first part (F1) of the optical s stem (OS);
a second providing step that provides the function (OF), said function identifying the optical system (OS), said second providing step comprising:
a generating sub-step (GEN), in which a virtual optical system (VOS) calculated and generated by a computer is used to generate a virtual function (VOF) calculated and generated by a computer, then
a modification sub-step (MOD), in which the virtual function (VOF) is modified to obtain the function (OF); and
a calculation step (CAL), in which the second equation (EF2) is calculated from the function (OF) and the first equation (EF1), and wherein the function (OF) of the optical system (OS) is defined as a function h of the opto-geometric properties of the optical system (OS), where OF=h(EF1$(x,y,z)$, EF2$(x,y,z)$).

2. The method according to claim 1, wherein the virtual optical system (VOS) comprises a first virtual part (VF1) defined by a first virtual equation (EVF1) and a second virtual part (VF2) defined by a second virtual equation (EVF2), the first virtual equation (EVF1) and the second virtual equation (EVF2) defining the virtual function (VOF).

3. The method according to claim 2, wherein the generating sub-step comprises selecting the first virtual equation (EVF1) in a database.

4. The method according to claim 2, wherein the method further comprises an equation modifying step in which the first virtual equation (EVF1) is modified by using a first modifying function (N1) so as to obtain a first modified equation (EV'F1), the first equation (EF1) being substantially equal to the first modified equation (EVF'1).

5. The method according to claim 4, wherein the first virtual part (VF1) comprises a first volume of the virtual optical system (VOS), the first equation (EF1) depending on opto-geometric characteristics of the first volume, and wherein the first modifying function (N1) modifies at least one of said opto-geometric characteristics.

6. The method according to claim 5, wherein the opto-geometric characteristics comprise at least one characteristic chosen from among an equation of a surface and an optical index of a volume.

7. The method according to claim 4, wherein the function (OF) depends on the difference between equations of a first surface and a second surface, and wherein a second surface modifying function (N2) is substantially equal to the first modifying function (N1).

8. The method according to claim 1, wherein the virtual function (VOF) is substantially equal to the function (OF).

9. The method according to claim 2, wherein the first virtual part (VF1) is a first virtual surface and the second virtual part (VF2) is a second virtual surface.

10. The method according to claim 1, wherein the function (OF) is an optical function (OF).

11. The method according to claim 1, wherein the optical system (OS) comprises a progressive power lens.

12. A computer program product for a data-processing device, the computer program product comprising a non-transitory computer-readable medium having encoded thereon a set of instructions which, when loaded into the data-processing device, causes the device to perform the method of claim 1.

13. A method of using a lens manufacturing machine to manufacture a lens at least in part on the basis of information representing an optical system (OS), the optical system (OS) being identified by a function (OF) and including a first part (F1) defined by a first equation (EF1), EF1($x,y,z$), which defines opto-geometric properties of part F1 at a spatial location defined by coordinates x, y, and z, and a second part (F2), defined by a second equation (EF2), EF2($x,y,z$), which defines opto-geometric properties of part F2, where the first part (F1) and the second part (F2) are a volume or surface of the optical system, (OS), the method comprising:

a first receiving step, in which the lens manufacturing machine receives the first equation (EF1), EF1($x,y,z$), said first equation (EF1), EF1($x,y,z$) defining opto-geometric properties of the first part (F1) of the optical system (OS);

a second receiving step, in which the lens manufacturing machine receives the function (OF), said function identifying the optical system (OS), said second receiving step comprising:

a first receiving sub-step, in which the lens manufacturing machine receives output of a generating step (GEN), in which a virtual optical system (VOS) is used to generate a virtual function (VOF), the virtual function and the virtual optical system both being calculated and generated by a computer, then a second receiving sub-step, in which the lens manufacturing machine receives output of a modification step (MOD), in which the virtual function (VOF) is modified to obtain the function (OF); and a third receiving step, in which the lens manufacturing machine receives output from a calculation step (CAL), in which the second equation (EF2) is calculated from the function (OF) and the first equation (EF1), and wherein the function (OF) of the optical system (OS) is defined as a function h of the opto-geometric properties of the optical system (OS), where OF=h(EF1($x,y,z$), EF2($x,y,z$)), and wherein the outputs received in the first, second, and third receiving step are used to control the lens manufacturing machine during manufacture of a lens.

* * * * *